United States Patent [19]

Li et al.

[11] Patent Number: 5,447,599
[45] Date of Patent: Sep. 5, 1995

[54] SELF-ALIGNED PROCESS FOR CAPPING COPPER LINES

[75] Inventors: Jian Li, Ithaca, N.Y.; James W. Mayer, Phoenix, Ariz.; Evan G. Colgan, Suffern, N.Y.; Jeffrey P. Gambino, Gaylordsville, Conn.

[73] Assignees: Cornell Research Foundation, Inc., Ithaca; International Business Machines Corporation, Armonk, both of N.Y.

[21] Appl. No.: 257,303

[22] Filed: Jun. 9, 1994

Related U.S. Application Data

[60] Division of Ser. No. 960,627, Oct. 13, 1992, Pat. No. 5,310,602, which is a continuation-in-part of Ser. No. 790,971, Nov. 12, 1991, Pat. No. 5,277,985.

[51] Int. Cl.⁶ .................. C23C 10/00; C23F 1/00; H01L 21/00
[52] U.S. Cl. ..................... 216/17; 437/188; 437/189; 437/190; 437/192; 437/246; 437/247; 216/51; 216/62; 216/78
[58] Field of Search .............. 156/646, 656, 664, 666; 437/188, 189, 190, 192, 228, 246, 247

[56] References Cited

U.S. PATENT DOCUMENTS 5,084,412  1/1992  Nakasaki ............... 437/189
5,126,283  6/1992  Pintchovski et al. ........... 437/192 X Primary Examiner—Thi Dang
Attorney, Agent, or Firm—Salzman & Levy

[57] ABSTRACT

The present invention features a process and a resulting article in which copper-based multilevel interconnects are fabricated. The copper-based multilevel interconnect formed by the inventive process first includes the process step of depositing a pattern of copper lines upon or in an applicable substrate, such as silicon dioxide. The copper lines are approximately one micron thick. The lines are coated with approximately 50 to 100 nm of titanium by sputter deposition, and undergo subsequent annealing at approximately 300° C. to 400° C. in an argon ambient. The titanium and copper layers are annealed to provide a $Cu_3Ti$ alloy at the copper/titanium junction. The unreacted titanium between the copper features is then stripped away by dry etching with fluorine-based etch. The remaining $Cu_3Ti$ alloy is subsequently transformed into TiN(O) and copper by a rapid thermal annealing in an $NH_3$ atmosphere at an approximate temperature of below 650° C., and then usually at temperatures ranging from between 550° C. to 650° C. for approximately five minutes. The copper lines are thereby capped with a layer of TiN(O), since oxygen is incorporated into the TiN layer during the heat treatment. The TiN(O) layer is more effective as a diffusion barrier than is TiN.

9 Claims, 1 Drawing Sheet

SELF-ALIGNED PROCESS FOR CAPPING COPPER LINES

RELATED APPLICATIONS

The present patent application is a division of U.S. patent application Ser. No. 07/960,627, filed Oct. 13, 1992, now U.S. Pat. No. 5,310,602, which is a continuation-in-part of U.S. patent application Ser. No. 07/790,971, filed Nov. 12, 1991, now U.S. Pat. No. 5,277,985.

FIELD OF THE INVENTION

The present invention pertains to Ultra-Large Scale Integration techniques in the fabrication of micro-circuits and, more particularly, to a method for fabricating copper-based multilevel interconnects in ultra-fast logic devices.

BACKGROUND OF THE INVENTION

The integration of a large number of components upon a single chip requires the formation of sophisticated interconnects. The interconnects should be formed with minimal signal delays and optimal packing density, in accordance with the principles enunciated in "On-Chip Wiring for VLSI: Status and Directions" by M. B. Small and D. J. Pearson, *IBM J. Res. Develop.*, Vol. 34, No. 6 (11/6/90) pp. 858–867.

To achieve the above objectives, the preferred interconnect material is copper. Copper provides a number of advantages for wiring applications including low resistivity and a high melting point.

At present, aluminum is the material used in fabricating interconnects on most integrated circuits. This invention seeks to replace the aluminum with copper in the fabrication of advanced integrated circuits and ultra-fast logic devices.

As previously mentioned in the aforesaid U.S. patent application Ser. No. 07/790,971, the use of copper as an interconnection material presents several problems, such as (1) copper oxidizes easily at low temperatures; (2) copper has poor adhesion to substrates; (3) copper has a high diffusion in silicon dioxide and other dielectric materials used in micro-circuitry; (4) copper has a low reaction temperature with most silicides; and (5) copper requires a high temperature for patterning by reactive ion etching (RIE).

In order to overcome these disadvantages when using copper as an interconnect material, it is necessary to passify the copper surfaces and provide diffusion barriers between the copper and the adjacent layers.

It has been proposed in the aforementioned U.S. patent application, Ser. No. 07/790,971, to TiN-encapsulate the copper fine line structure by annealing the copper-titanium alloy lines in an $NH_3$ ambient. This technique is very versatile because a barrier layer can be formed simultaneously on all exposed surfaces of the copper lines.

A number of limitations to the above method have been discovered, however, particularly when forming fully-planar copper lines by filling grooves in a dielectric and removing the excess. In this case, the copper alloy must be deposited into a feature without leaving a void, so electroplating or chemical vapor deposition is required. It is difficult to deposit refractory metal-copper alloys, such as copper-titanium, with electroplating or chemical vapor deposition techniques. Additionally, any residual titanium in the copper lines increases the resistivity above that of pure copper.

The present invention discloses a self-aligning process for capping the copper lines without the need for deposition of a copper alloy (such as copper-titanium).

SUMMARY OF THE INVENTION

In accordance with the present invention, there are provided a process and a resulting article therefrom in which copper based multilevel interconnects are fabricated. The copper based multilevel interconnects formed by the inventive process first includes the process step of depositing a pattern of copper lines upon an applicable substrate such as silicon dioxide. The copper lines may be formed either by patterning copper above a deposited dielectric (such as by RIE), or by defining a pattern of features (lines or vias) in a dielectric, filling these by copper deposition, and removing the excess. The process will be described for the case of patterned copper above a dielectric film, but would work equally well for the other case also. The copper lines are approximately one micron thick. The copper lines are coated with approximately 50 to 100 nm of titanium by sputter deposition, and undergo subsequent annealing at approximately 300° C. to 400° C. in an argon ambient. The titanium and copper layers are annealed to provide a $Cu_3Ti$ alloy at the copper/titanium junction. The unreacted titanium, which was not in contact with a Cu feature, is then stripped away by dry etching with fluorine-based etch, such as $SF_6$, or $CF_4$, or $NF_3$. The $Cu_3Ti$ alloy is etched much slower than the unreacted Ti. The remaining $Cu_3Ti$ alloy is subsequently transformed into TiN(O) and copper by a rapid thermal annealing (RTA) in an $NH_3$ atmosphere at an approximate temperature of below 650° C. and usually at temperatures ranging from between 550° C. to 650° C. for approximately five minutes. The copper lines thereby are capped with a layer of TiN(O). Since oxygen is incorporated into the TiN layer during the heat treatment, the TiN(O) layer is more effective as a diffusion barrier than is TiN.

The advantage of the above-mentioned process over the previous invention is that the copper is capped by a self-aligning method, regardless of how the copper lines are patterned. The low resistivity of the bulk of the copper in the lines is maintained by only alloying surface layer of Cu with the titanium. The resulting rapid annealing of the titanium/copper alloy in the $NH_3$ ambient requires a shorter annealing time, since no long-range migration of titanium occurs during the nitriding process. Additionally, Cu is deposited instead of a copper-titanium alloy.

BRIEF DESCRIPTION OF THE DRAWINGS

A complete understanding of the present invention may be obtained by reference to the accompanying drawings, when considered in conjunction with the subsequent, detailed description, in which.

Note, these figures are not to scale and are for illustrative purposes only.

DESCRIPTION OF THE PREFERRED EMBODIMENT

The invention features the fabrication of copper based multilevel interconnects by means of a self-aligning capping of copper features on the substrate of a micro-circuit chip. The process is a continuation-in-part of previously filed U.S. patent application, Ser. No. 07/790,971, the teachings and subject matter of which are hereby incorporated by reference.

The previous process described forming a TiN of TIN(O) capping layer on a copper-titanium alloy line or feature. Two disadvanteges of this process are increased resistance due to residual Ti in the copper and the requirement of depositing a Cu-Ti alloy. It is difficult to deposit refractory metal Cu alloys by electroplating or chemical vapor deposition.

These problems are avoided by depositing Ti over the patterned Cu, reacting the Ti to form Cu$_3$Ti where the Ti is in contact with the Cu, and etching away the excess Ti between features.

The current invention then reacts the titanium-copper alloy formed by annealing with NH$_3$ to form TiN. The presence of any oxygen in the titanium-copper alloy or NH$_3$ ambient results in the TiN containing oxygen (TiN(O)). The TiN(O) is a more effective diffusion barrier than TiN. In addition, the lack of long-range titanium diffusion speeds up the subsequent nitriding process step.

Figure 1:
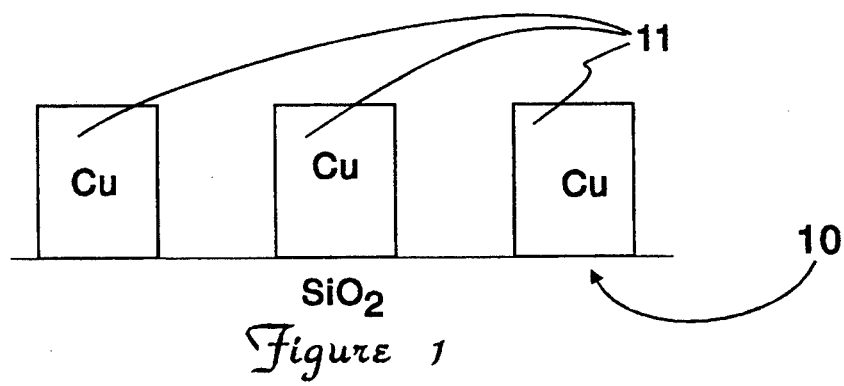
FIG. 1 is an enlarged sectional view of copper lines being deposited and patterned upon a silicon dioxide substrate in the formation of a micro-circuit.

Now referring to FIG. 1, an enlarged sectional view of a silicon dioxide substrate 10 is shown. The silicon dioxide substrate 10 is patterned with a plurality of copper lines 11, as shown. The copper lines are approximately one micron thick.

Figure 2:
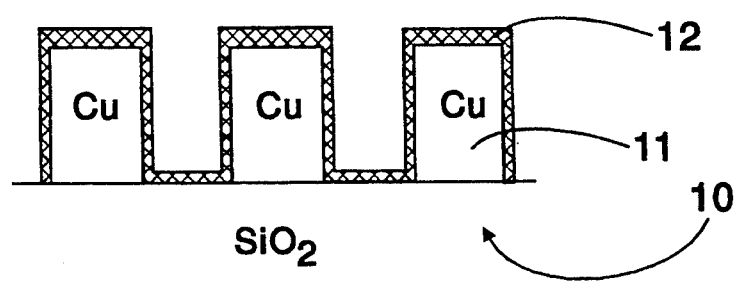
FIG. 2 is an enlarged sectional view of the copper lines being overlaid with a layer of titanium.
Figure 3:
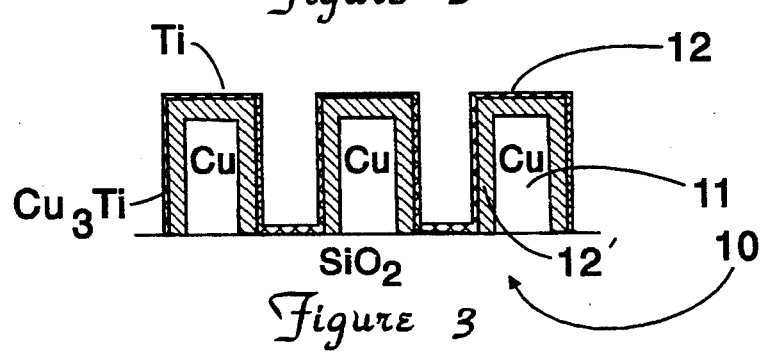
FIG. 3 is an enlarged sectional view of the formation of a copper-titanium alloy at the copper/titanium junction.

Referring to FIGS. 2 and 3, the copper patterned substrate 10 is next overlaid with a thin layer 12 of titanium. The titanium layer 12 is sputter deposited and annealed in an Argon atmosphere at a temperature in the range of from 300° C. to 400° C. The sputter deposition is achieved using a DC sputtering system (CVC). The annealing is accomplished in a quartz tube heated by a furnace (Lindberg Company). The annealing causes the titanium and the copper to form titanium/copper compounds (Cu$_3$Ti) at the junction between the copper and the titanium layers, as depicted by diffusion layer 12'.

Figure 4:
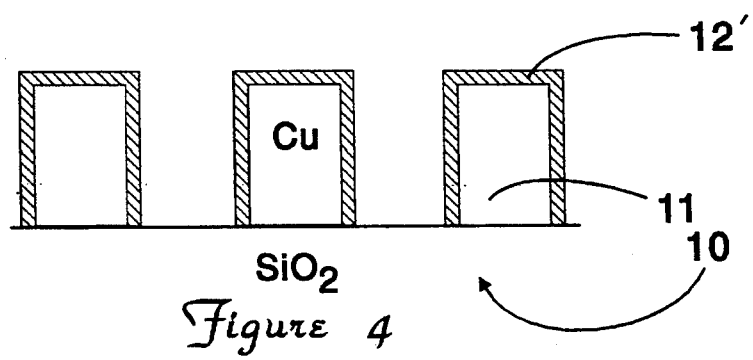
FIG. 4 is an enlarged sectional view of residual, titanium-free, alloyed copper/titanium lines resulting from a dry etching with fluorine-based etch.

Referring to FIG. 3, the unreacted titanium (outer layer 12) is next stripped away from the titanium/copper compound layer 12' by means of a dry etching process utilizing fluorine-based gas, such as CF$_4$, SF$_6$, or NF$_3$. Some of the compound layer 12' is also removed, as shown in FIG. 4.

Figure 5:
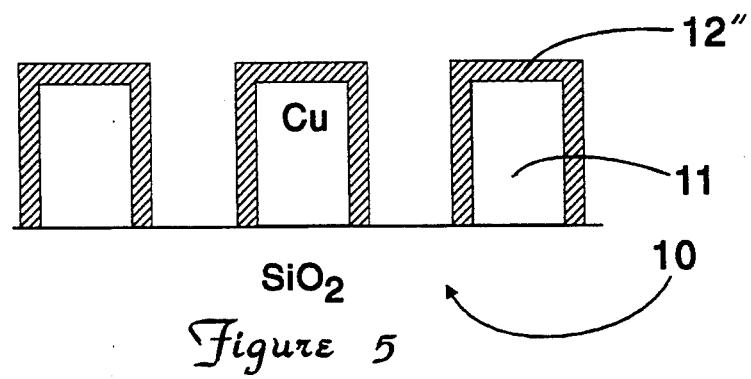
FIG. 5 is an enlarged sectional view of TiN(O) lines deposited upon the silicon dioxide substrate as a result of rapid annealing in an NH$_3$ ambient.

Referring to FIG. 5, the remaining titanium/copper compound layer 12' is next annealed in an NH$_3$ ambient in a rapid thermal annealing (RTA) oven at an approximate temperature in the range of 550° C. to 650° C. The formation of TiN or TiN(O) is accomplished very rapidly, in approximately only five minutes. The annealing step transforms layer 12' to a TiN(O) layer 12". Layer 12" caps any copper 11 that may have been exposed when the titanium layer 12 (FIG. 2) was deposited. The oxygen in the titanium nitride layer 12" is incorporated during the annealing process. This new oxygen-containing titanium nitride layer 12" is more effective as a diffusion barrier than the TiN layer without oxygen.

The process forming the new TiN(O) layer 12" is very similar in technique to a salicide process, which forms layers of TiN/TiSi$_2$/Si, except that the titanium/copper compounds are subsequently transformed into TiN(O) and copper. This method should be applicable to any refractory metal that forms a compound with copper and forms a nitride or oxide which acts as a copper diffusion barrier.

The invention achieves several synergistic results, in which: (a) the capping of the copper lines is self-aligning, regardless of how they may be patterned; (b) the surface alloying of the copper with the titanium retains the low resistivity of the copper, which is the bulk of the material in the lines; (c) there is an unexpected advantage in the nitride annealing step over previous work, since the use of copper instead of a copper-titanium alloy now allows for much more rapid anneal times.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method of fabricating copper-based interconnects, comprising the steps of:
   a) depositing copper lines on or in a substrate;
   b) overlaying said copper lines with a layer of titanium or other refractory metal;
   c) annealing the overlaid copper lines to form copper/titanium or copper/other refractory metal compounds;
   d) removing titanium or refractory metal from between said copper lines; and
   e) nitriding or oxidizing said copper/titanium or refractory metal compounds to form a diffusion barrier upon said copper lines.

2. The method of claim 1, wherein titanium is the layer overlaying said copper line and said nitriding step (e) forms a layer of TiN(O) or TiN upon said copper lines.

3. The method of claim 1, wherein said removing step (d) includes dry etching with fluorine-based etch.

4. The method of claim 1, wherein said nitriding step (e) includes annealing the copper/titanium or copper/other refractory metal compounds in an NH$_3$ ambient at a temperature of approximately below 650° C.

5. The method of claim 4, wherein the annealing step (e) is performed for at least approximately five minutes.

6. The method of claim 4, wherein the annealing step (e) is accomplished in an approximate temperature range of 550° C. to 650° C.

7. The method of claim 1, wherein the overlaying step (b) forms a layer of approximately between 50 to 100 nm of titanium or other refractory metal over the copper lines.

8. The method of claim 7, wherein the overlaying step (b) includes sputtering said titanium or other refractory metal upon said copper lines.

9. The method of claim 1, wherein said annealing step (c) includes annealing said titanium or other refractory metal overlaid copper lines in an argon ambient in an approximate temperature range of between 300° C. and 400° C.

* * * * *